1/20/87 XR 4,638,207

United States Patent [19]

Radice

[11] Patent Number: 4,638,207

[45] Date of Patent: Jan. 20, 1987

[54] PIEZOELECTRIC POLYMERIC FILM BALLOON SPEAKER

[75] Inventor: Peter F. Radice, Upper Merion, Pa.

[73] Assignee: Pennwalt Corporation, Philadelphia, Pa.

[21] Appl. No.: 841,137

[22] Filed: Mar. 19, 1986

[51] Int. Cl.[4] .......... H01L 41/08

[52] U.S. Cl. .......... 310/328; 310/330; 310/334; 310/338; 310/800

[58] Field of Search .......... 310/800, 323, 328, 330, 310/331, 332, 338, 339, 334, 335; 179/110 A

[56] References Cited

U.S. PATENT DOCUMENTS

| | | | |
|---|---|---|---|
| 3,792,204 | 2/1974 | Murayama et al. | 310/800 X |
| 4,064,375 | 12/1977 | Russell et al. | 310/800 X |
| 4,088,915 | 5/1978 | Kodama | 310/800 X |
| 4,166,229 | 8/1979 | De Reggi et al. | 310/800 X |
| 4,401,911 | 8/1983 | Ravinet et al. | 310/800 |
| 4,423,768 | 1/1984 | Edelman et al. | 310/800 X |
| 4,504,761 | 3/1985 | Triplett | 310/800 |
| 4,517,665 | 5/1985 | De Reggi et al. | 310/800 X |

OTHER PUBLICATIONS

Model for a Compliant Tube Polymer Hydrophone, by D. Ricketts, JASA, vol. 79, No. 5, May 1986, pp. 1603-1609.

*Primary Examiner*—Mark O. Budd

[57] ABSTRACT

Piezoelectric polymer film, when conformably adhered to inner or outer curved surfaces of an inflated balloon, for example, acts as a speaker when the metallized coatings of the film are suitably connected to the output of an audio device. The film may be in the form of an helical strip, or individual strips elastically serially connected, or may itself form the inflatable material. Amplifying and impedance matching means may be interposed between the audio output and film coatings.

13 Claims, 7 Drawing Figures

PIEZOELECTRIC POLYMERIC FILM BALLOON SPEAKER

STATEMENT OF THE INVENTION

This invention relates to piezoelectric polymeric films and more particularly concerns such films which function as mobile and maneuverable speakers when strips or portions thereof are conformably secured to the curved surfaces of an inflated balloon, or the film itself is made to function as the inflated balloon. The metallized coating electrodes of the film are suitably connected to the output of an audio device.

BACKGROUND AND SUMMARY OF THE INVENTION

Underwater acoustic transducers employing polymeric piezoelectric film materials are known. In British patent No. 2,120,902, a shell of PVDF material is provided with the usual conductive coatings on each face thereof. When an alternating current of 100 cycles per second is applied to the coatings, the shell vibrates to act as an underwater sound generator.

In U.S. Pat. No. 2,939,970, a spherical microphone assembly includes spherical outer and inner electrodes with a spherical ceramic transducer element therebetween. The assembly may also be used as a loudspeaker. The spherical configuration of the microphone assembly is similar to the balloon shaped speaker of the present invention.

In U.S. Pat. No. 4,284,921, various configurations, including hemispherical, of thermoformed piezoelectric polymeric film materials are disclosed as transducer elements for purposes of receiving and transmitting.

The existing patented devices abovementioned do not suggest the present speaker which is light in weight, maneuverable, deflatable for easy storage and transport, and sufficiently inexpensive to permit its use at entertainment centers and celebrations where tables of guests, for example, could each have an individual balloon speaker with a preferred sound volume, and where the height of the inflatable balloon, filled with helium, for example, could be easily controlled. The electrodes or metallized film coatings of the piezoelectric polymeric film are connected to the output of an audio tape player, radio receiver, phonograph amplifier, and the like, each capable of delivering an adequate signal to energize the piezo film. Conventional amplification and impedance matching devices may be interposed between the audio device and piezoelectric film.

Additionally, the piezoelectric polymeric films of the present invention may function as a highly mobile and maneuverable microphone as well as sender/receiver of ultrasonic signals for communication, surveillance, and range finding purposes, when suitably attached and connected to an inflated balloon.

GENERAL DESCRIPTION OF THE PIEZOELECTRIC POLYMERIC FILM

Generally, polymeric materials are non-piezoelectric. Polyvinylidene fluoride (PVDF) is approximately 50% crystalline and 50% amorphous. The principal crystalline forms of PVDF are the highly polar $\beta$ form and the non-polar $\alpha$ form. High piezo response is associated with the polar $\beta$ form. By carefully controlling process steps to polarize the film, including mechanical orientation and treatment in an intense electric field, a highly piezoelectric and pyroelectric film results. Such a film is commercially available under the trademark KYNAR ®, a product of Pennwalt Corporation, Philadelphia, PA., assignee of the present invention.

The procedure for poling is well known in the art and, in the case of dielectric polymer films, generally involves the application of a direct current voltage, e.g., 300 to 2000 kilovolts per centimeter of thickness of polymer film while first heating it to a temperature ranging between just above room temperature to just below the melting point of the film for a period of time and then, while maintaining the potential, cooling the film. Preferred systems for the continuous poling of piezoelectric (or pyroelectric) sensitive polymer film using a corona discharge to induce the piezoelectric charge are described in U.S. Pat. No. 4,392,178 and U.S. Pat. No. 4,365,283.

The invention is not limited to films made of PVDF only, and copolymers of vinylidene fluoride, and copolymerizable comonomers such as tetrafluoroethylene and trifluoroethylene, for example, may be employed.

DETAILED DESCRIPTION OF THE INVENTION

Figure 1:
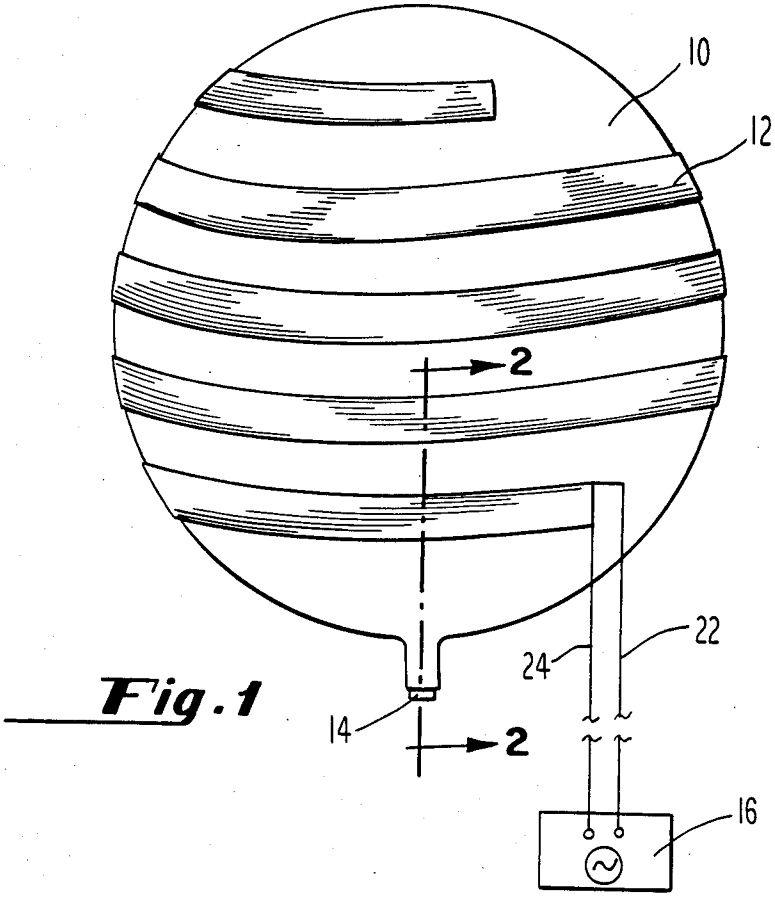
FIG. 1 is a perspective view, partially diagrammatic, of an embodiment of the present invention, illustrating an inflated balloon with a helical strip of the piezoelectric film secured therearound.

Referring now to FIG. 1, inflated balloon 10 is provided with an helical strip of piezoelectric polymeric film material, typically PVDF, secured therearound. Balloon 10 is suitably rubber or polyester and may have a diameter approaching 1 inch, but preferably will be about 1 to 3 feet in diameter since the curvature of such sized balloons provide quality reproduction of the audio signals. The balloon need not be spherical but should provide curved surfaces.

If balloon 10 has a diameter of about 2 feet, then helical strip 12 will typically be about 1 to 3 inches wide with similar spacings between turns. It is not intended that strip 12 and spacings between turns be limited to the widths abovementioned since cost and quality considerations will normally dictate the total area of the piezoelectric PVDF film to be secured to any balloon, it being understod that the cost of the balloon speaker will rise as the amount of PVDF film used thereon increases. It should also be understood that the amplitude of the sound transmitted by the balloon film might not be sufficiently audible if the area of the film is excessively reduced.

PVDF film may be suitably secured to balloon 12 by double-sided tape, for example, a pressure-sensitive spray adhesive, and the like.

Stopper 14, typically rubber, permits balloon 10 to remain inflated.

Figure 2:
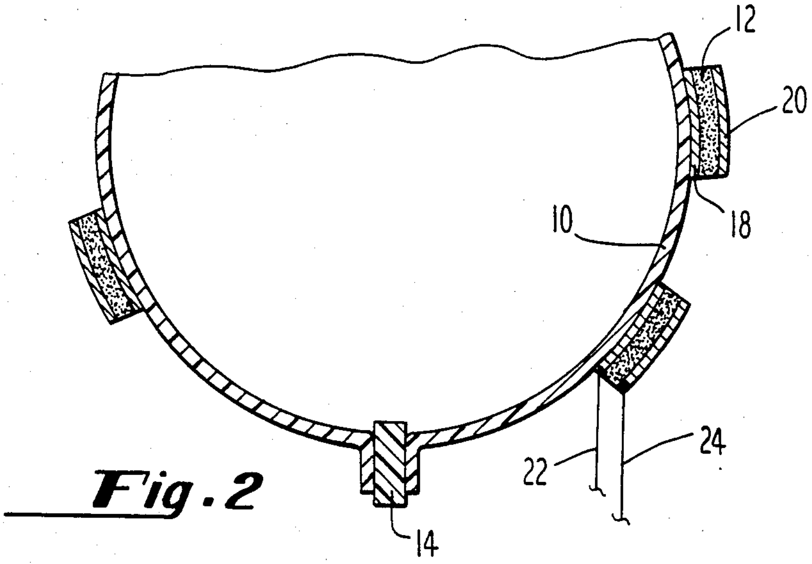
FIG. 2 is a sectional view of FIG. 1 taken along line 2—2 thereof.

Referring additionally to FIG. 2, the output of audio device 16, typically a tape player, radio receiver, phonograph amplifier, and the like, is capable of delivering an adequate signal to PVDF film 12 by means of metallized surface coatings 18 and 20 via conductors 22 and 24 respectively. Initially, the output of audio device 16 may be amplified, and by suitable transformer means (not shown), the impedances of the amplified output and the speaker film matched. The electromagnetic energy outputted from audio device 16 produces mechanical stresses on PVDF film 12 which, in turn, retransmits the original audio signals.

Figure 3:
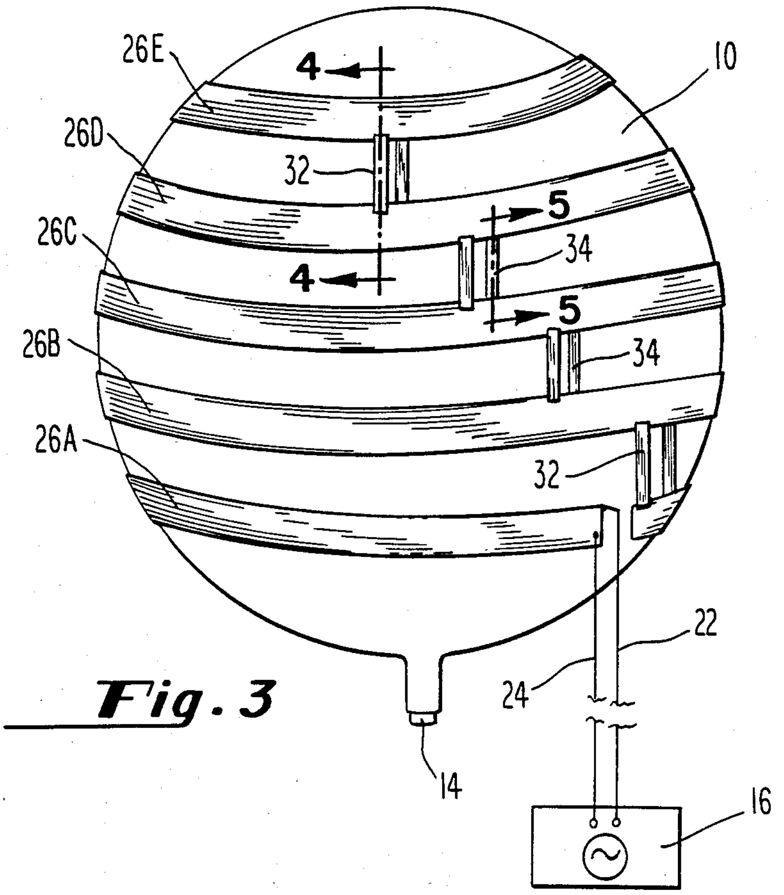
FIG. 3 is a view similar to FIG. 1, wherein the piezoelectric film comprises individual strips thereof.
Figure 4:
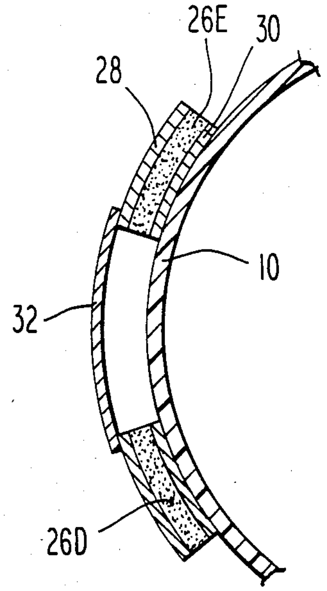
FIGS. 4 and 5 are sectional views of FIG. 3 taken along lines 4—4 and 5—5 respectively.
Figure 5:
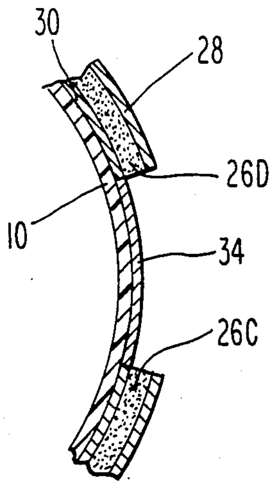

In FIGS. 3, 4 and 5, the PVDF film may be identical to PVDF film 12 of FIG. 1, but in the form of individual strips 26A through 26E, for example. Each strip 26A–26E will have its outer surface coating 28 and inner surface coating 30 electrically serially connected to its adjacent strip by means of connectors 32 and 34 respectively. Connectors 32 and 34 may comprise copper tape, Mylar with conductive ink deposited thereon to provide an electrical connection, conductive adhesives, and the like. Audio signals from the output of audio device 16 are supplied to PVDF film 26A through conductors 22 and 24. Since strips 26A–26E are serially connected, each of the strips contributes to the output of audio energy from balloon 10.

Figure 6:
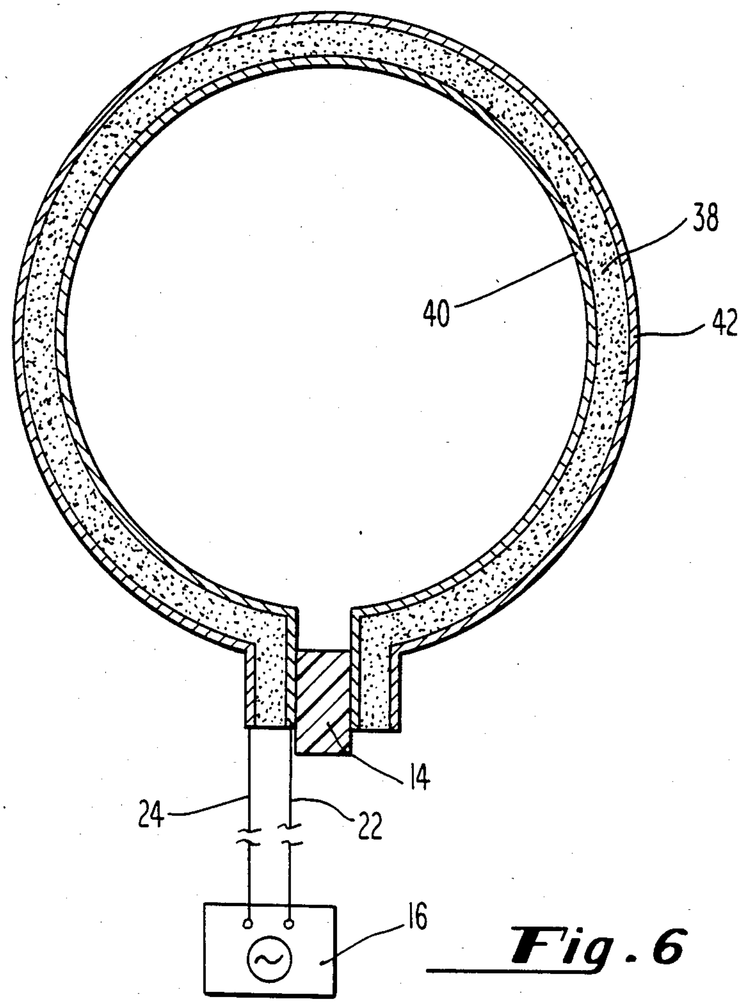
FIG. 6 is a sectional view, partially diagrammatic, of another embodiment of the present invention.

In FIG. 6, PVDF film 38 comprises the balloon, along with its metallized surface coatings 40 and 42. Stopper 14 maintains the balloon in an inflated state. Output of audio device 16 is connected to the coatings, as described above. It is to be understood that in each of the present embodiments, it may be desirable if a suitable amplifier (not shown) receives the audio output signals from amplification thereof prior to the amplified signals being connected to the film coatings. Of course, matching of impedances, as aforediscussed, may be effected after amplification but prior to the connections to the film coatings. Amplification and impedance matching means are not shown or further described herein. A skilled audio artisan could readily employ such means, if desired.

Figure 7:
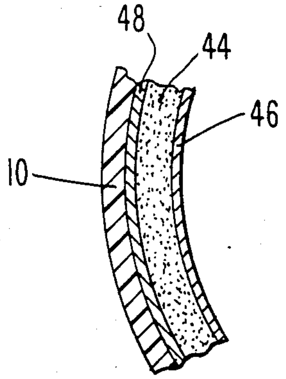
FIG. 7 is a fragmentary sectional view of yet another embodiment of the present invention.

In FIG. 7, PVDF film 44 with coatings 46 and 48 is adheringly disposed interiorly balloon 10. The usual electrical connections from the audio device are made to the coatings.

Fabrication of the speaker balloons of FIGS. 6 and 7 is within the skill of the balloon manufacturing art.

The thickness of the piezoelectric polymeric film used in the present invention may range between about 6μ to 110μ, and preferably 20 to 50μ whereas the metallized film electrode coatings will typically be about 6–8μ in the thickness. The coatings may be conveniently deposited on the piezoelectric polymeric film by a conventional silk screening process, for example, the silk-screening conductive ink comprising a finely divided electrically conductive metal, suitably silver, nickel or copper embedded within a polymer matrix.

The strips of FIGS. 1 and 3 may be adhered to the curved surfaces of the balloon's interior.

Balloon speakers, in accordance with the present invention, having a diameter of only about 6 inches, for example, produced faithful retransmission of the audio signals at decibel levels higher than typical normal home listening volumes.

The helical strip of film need not have equal spacings between turns; nor is it required that the individual strips have equal spacings therebetween. The strips of film may be disposed asymetrically around or within the balloon.

I claim:

1. Apparatus for retransmitting audio signals from an audio device remotely located from, and supplying said signals to, said apparatus which comprises inflatable means having curved outer surfaces, piezoelectric polymer film means conformably adhering to said outer surfaces of said inflatable means while inflated, said piezoelectric film having an electrode film coating disposed over each face thereof, conductor means operably connected between output of said audio device and said electrode coatings for transmitting said audio signals to said film, said film converting electromagnetic energy of said transmitted signals to retransmitted audio signals corresponding to said transmitted audio signals.

2. Apparatus of claim 1 wherein amplifying means and impedance matching means are interposed between said output of said audio device and said film means.

3. Apparatus of claim 1 wherein said piezoelectric polymer film is polyvinylidene fluoride.

4. Apparatus of claim 1 wherein said inflatable means is a balloon.

5. Apparatus of claim 4 wherein said balloon is filled with air.

6. Apparatus of claim 4 wherein said balloon is filled with a gas lighter in weight than air.

7. Apparatus of claim 1 wherein said film comprises an helical strip.

8. Apparatus of claim 1 wherein said film comprises individual strips thereof in spaced distribution around said inflatable means, said coatings on said film comprising an outer coating and an inner coating, each of said individual strips having electrical connecting means connected between adjacent outer coatings and between adjacent inner coatings, each of said connecting means being disposed in spaced relationship to each other.

9. Apparatus of claim 7 wherein said helical strip is comformably secured to interior curved surfaces of said inflatable means.

10. Apparatus of claim 8 wherein said individual strips are secured to interior of said inflatable means.

11. Apparatus of retransmitting audio signals from an audio device remotely located from, and supplying said signals to, said apparatus which comprises inflatable means having curved outer surfaces, said inflatable means comprising a piezoelectric polymer film having a metallized electrode film coating disposed over an outer surface of said film to form an outer electrode coating and an inner surface of said film to form an inner electrode coating, conductor means operably connected between output of said audio device and said outer and inner electrode coatings of said film for transmitting audio signals in the form of electromagnetic energy to said film, said film converting said electromagnetic energy to retransmitted audio signals corresponding to said transmitted audio signals.

12. Apparatus of claim 11 wherein said film is conformably adhered to curved surfaces comprising interior of an inflatable and deflatable balloon.

13. Apparatus of claim 11 wherein amplifying means and impedance matching means are interposed between said output of said audio device and said coatings of said film.

* * * * *